(12) United States Patent
Kagan

(10) Patent No.: US 7,747,733 B2
(45) Date of Patent: Jun. 29, 2010

(54) POWER METER HAVING MULTIPLE ETHERNET PORTS

(75) Inventor: Erran Kagan, Port Washington, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 1562 days.

(21) Appl. No.: 11/039,316

(22) Filed: Jan. 19, 2005

(65) Prior Publication Data

US 2006/0161400 A1 Jul. 20, 2006

Related U.S. Application Data

(60) Provisional application No. 60/621,750, filed on Oct. 25, 2004.

(51) Int. Cl.
 G06F 15/16 (2006.01)
 G06F 11/00 (2006.01)
(52) U.S. Cl. .............. 709/224; 709/223; 707/104.1; 710/7; 710/8; 702/61
(58) Field of Classification Search ......... 709/223–224; 707/104.1; 710/7–8; 702/61
See application file for complete search history.

(56) References Cited

U.S. PATENT DOCUMENTS

| 5,459,459 | A | 10/1995 | Lee, Jr. |
|---|---|---|---|
| 5,572,438 | A | 11/1996 | Ehlers et al. |
| 5,627,759 | A | 5/1997 | Bearden et al. |
| 5,650,936 | A | 7/1997 | Loucks et al. |
| 5,736,847 | A | 4/1998 | Van Doorn et al. |
| 5,828,576 | A | 10/1998 | Loucks et al. |
| 5,862,391 | A | 1/1999 | Salas et al. |
| 5,897,607 | A | 4/1999 | Jenney et al. |
| 5,995,911 | A | 11/1999 | Hart |
| 6,000,034 | A | 12/1999 | Lightbody et al. |
| D427,533 | S | 7/2000 | Cowan et al. |
| D429,655 | S | 8/2000 | Cowan et al. |
| D435,471 | S | 12/2000 | Simbeck et al. |
| 6,185,508 | B1 | 2/2001 | Van Doorn et al. |
| 6,186,842 | B1 | 2/2001 | Hirschbold et al. |
| D439,535 | S | 3/2001 | Cowan et al. |

(Continued)

OTHER PUBLICATIONS

Xu Hong, Wang Jianhua, "An Extendable Data Engine based on OPC Specification"; Computer Standards & Interfaces 26 (2004) 515-525; Dec. 5, 2003.

(Continued)

*Primary Examiner*—Alina N. Boutah
(74) *Attorney, Agent, or Firm*—Michael J Porco; Gerald E Hespos

(57) ABSTRACT

A power meter or other electrical device is provided having two independent and communicatively isolated Ethernet ports. The first Ethernet port is addressable by a first unique identifier and is configured for enabling full access to the power meter via an internal LAN. This enables a LAN operator to remotely access the power meter via the internal LAN for performing metering functions, such as full telemetry, control and programming. The second Ethernet port is addressable by a second unique identifier and is configured for being connected to the Internet. Since the second Ethernet port is communicatively isolated from the first Ethernet port, a user can access the power meter via the Internet, but cannot access the internal LAN by connecting to the power meter via the Internet.

34 Claims, 9 Drawing Sheets

U.S. PATENT DOCUMENTS

| Patent No. | Date | Inventor | Ref |
|---|---|---|---|
| 6,236,949 B1 | 5/2001 | Hart | |
| D443,541 S | 6/2001 | Hancock et al. | |
| 6,301,527 B1 | 10/2001 | Butland et al. | |
| 6,363,057 B1 | 3/2002 | Ardalan et al. | |
| 6,396,839 B1 | 5/2002 | Ardalan et al. | |
| 6,397,155 B1 | 5/2002 | Przydatek et al. | |
| D458,863 S | 6/2002 | Harding et al. | |
| D459,259 S | 6/2002 | Harding et al. | |
| 6,493,644 B1 | 12/2002 | Jonker et al. | |
| 6,553,418 B1* | 4/2003 | Collins et al. | 709/224 |
| 6,563,697 B1 | 5/2003 | Simback et al. | |
| 6,611,773 B2 | 8/2003 | Przydatek et al. | |
| 6,611,922 B2 | 8/2003 | Ozcetin et al. | |
| 6,615,147 B1 | 9/2003 | Jonker et al. | |
| 6,636,030 B1 | 10/2003 | Rose et al. | |
| 6,671,635 B1 | 12/2003 | Forth et al. | |
| 6,671,654 B1 | 12/2003 | Forth et al. | |
| 6,687,627 B1* | 2/2004 | Gunn et al. | 702/61 |
| 6,694,270 B2 | 2/2004 | Hart | |
| 6,735,535 B1 | 5/2004 | Kagan et al. | |
| 6,737,855 B2 | 5/2004 | Huber et al. | |
| 6,745,138 B2 | 6/2004 | Przydatek et al. | |
| 6,751,562 B1 | 6/2004 | Blackett et al. | |
| 6,751,563 B2 | 6/2004 | Spanier et al. | |
| 6,792,337 B2 | 9/2004 | Blackett et al. | |
| 6,792,364 B2 | 9/2004 | Jonker et al. | |
| 6,798,190 B2* | 9/2004 | Harding et al. | 324/142 |
| 6,798,191 B1 | 9/2004 | Macfarlane et al. | |
| 6,813,571 B2 | 11/2004 | Lightbody et al. | |
| 6,825,776 B2 | 11/2004 | Lightbody et al. | |
| 6,853,978 B2 | 2/2005 | Forth et al. | |
| 6,871,150 B2 | 3/2005 | Huber et al. | |
| D505,087 S | 5/2005 | Ricci et al. | |
| 6,894,979 B1 | 5/2005 | Lee | |
| 6,944,555 B2 | 9/2005 | Blackett et al. | |
| 6,957,158 B1* | 10/2005 | Hancock et al. | 702/61 |
| 6,961,641 B1 | 11/2005 | Forth et al. | |
| 6,983,211 B2 | 1/2006 | Macfarlene et al. | |
| 6,988,025 B2 | 1/2006 | Ransom et al. | |
| 6,988,182 B2 | 1/2006 | Teachman et al. | |
| 6,990,395 B2 | 1/2006 | Ransom et al. | |
| 7,006,934 B2 | 2/2006 | Jonker et al. | |
| 7,010,438 B2 | 3/2006 | Hancock et al. | |
| 7,047,216 B2* | 5/2006 | Kashti | 705/35 |
| 7,072,779 B2 | 7/2006 | Hancock et al. | |
| 7,085,824 B2* | 8/2006 | Forth et al. | 709/221 |
| 7,089,089 B2 | 8/2006 | Cumming et al. | |
| 7,127,328 B2 | 10/2006 | Ransom | |
| D532,747 S | 11/2006 | Ricci et al. | |
| 7,136,384 B1 | 11/2006 | Wang | |
| D534,120 S | 12/2006 | Ricci et al. | |
| 7,155,350 B2 | 12/2006 | Kagan | |
| 7,158,050 B2 | 1/2007 | Lightbody et al. | |
| 7,174,258 B2 | 2/2007 | Hart | |
| 7,174,261 B2 | 2/2007 | Gunn et al. | |
| 7,184,904 B2 | 2/2007 | Kagan | |
| 7,188,003 B2 | 3/2007 | Ransom et al. | |
| 7,191,076 B2 | 3/2007 | Huber et al. | |
| 7,216,043 B2 | 5/2007 | Ransom et al. | |
| 7,246,014 B2 | 7/2007 | Forth et al. | |
| 7,248,977 B2 | 7/2007 | Hart | |
| 7,248,978 B2 | 7/2007 | Ransom | |
| 7,249,265 B2 | 7/2007 | von Carolsfeld et al. | |
| 7,256,709 B2 | 8/2007 | Kagan | |
| 7,271,996 B2 | 9/2007 | Kagan et al. | |
| 7,294,997 B2 | 11/2007 | Kagan | |
| 7,304,586 B2 | 12/2007 | Wang et al. | |
| 7,305,310 B2 | 12/2007 | Slota et al. | |
| 7,337,081 B1 | 2/2008 | Kagan | |
| 7,379,997 B2* | 5/2008 | Ehlers et al. | 709/224 |
| 7,415,368 B2* | 8/2008 | Gilbert et al. | 702/61 |
| 7,447,760 B2* | 11/2008 | Forth et al. | 709/223 |
| 7,447,762 B2* | 11/2008 | Curray et al. | 709/224 |
| 2002/0091784 A1 | 7/2002 | Baker et al. | |
| 2002/0114326 A1 | 8/2002 | Mahalingaiah | |
| 2002/0120723 A1 | 8/2002 | Forth et al. | |
| 2002/0162014 A1 | 10/2002 | Przydatek et al. | |
| 2002/0165677 A1 | 11/2002 | Lightbody et al. | |
| 2003/0009401 A1 | 1/2003 | Ellis | |
| 2003/0014200 A1 | 1/2003 | Jonker et al. | |
| 2003/0065459 A1 | 4/2003 | Huber et al. | |
| 2003/0084112 A1* | 5/2003 | Curray et al. | 709/208 |
| 2003/0101008 A1 | 5/2003 | Hart | |
| 2003/0105608 A1 | 6/2003 | Hart | |
| 2003/0132742 A1 | 7/2003 | Harding et al. | |
| 2003/0154471 A1* | 8/2003 | Teachman et al. | 717/171 |
| 2003/0176952 A1* | 9/2003 | Collins et al. | 700/286 |
| 2003/0210699 A1 | 11/2003 | Holt, Sr. et al. | |
| 2003/0212512 A1 | 11/2003 | Hart | |
| 2003/0220752 A1* | 11/2003 | Hart | 702/61 |
| 2004/0066311 A1 | 4/2004 | Giles et al. | |
| 2004/0113810 A1 | 6/2004 | Mason et al. | |
| 2004/0138786 A1 | 7/2004 | Blackett et al. | |
| 2004/0138787 A1 | 7/2004 | Ransom et al. | |
| 2004/0138835 A1 | 7/2004 | Ransom et al. | |
| 2004/0172207 A1 | 9/2004 | Hancock et al. | |
| 2004/0183522 A1 | 9/2004 | Gunn et al. | |
| 2004/0229578 A1 | 11/2004 | Lightbody et al. | |
| 2005/0017874 A1 | 1/2005 | Lightbody et al. | |
| 2005/0027464 A1 | 2/2005 | Jonker et al. | |
| 2005/0071106 A1 | 3/2005 | Huber et al. | |
| 2005/0275397 A1 | 12/2005 | Lightbody et al. | |
| 2005/0288876 A1 | 12/2005 | Doig et al. | |
| 2005/0288877 A1 | 12/2005 | Doig et al. | |
| 2006/0052958 A1 | 3/2006 | Hancock et al. | |
| 2006/0071813 A1 | 4/2006 | Kagan | |
| 2006/0077999 A1* | 4/2006 | Kagan et al. | 370/466 |
| 2006/0086893 A1 | 4/2006 | Spanier et al. | |
| 2006/0161400 A1 | 7/2006 | Kagan | |
| 2006/0170409 A1 | 8/2006 | Kagan et al. | |
| 2006/0187956 A1 | 8/2006 | Doviak et al. | |
| 2006/0230394 A1 | 10/2006 | Forth et al. | |
| 2006/0271244 A1 | 11/2006 | Cumming et al. | |
| 2006/0271314 A1* | 11/2006 | Hayes | 702/62 |
| 2007/0067119 A1* | 3/2007 | Loewen et al. | 702/57 |
| 2007/0067121 A1 | 3/2007 | Przydatek et al. | |
| 2007/0114987 A1* | 5/2007 | Kagan | 324/142 |
| 2007/0136010 A1 | 6/2007 | Gunn et al. | |
| 2008/0046205 A1* | 2/2008 | Gilbert et al. | 702/62 |
| 2008/0065335 A1 | 3/2008 | Doig et al. | |

OTHER PUBLICATIONS

Multi-port Communications Card (MPCC), Multip-Port Ethernet Communications Card (MPE), Installation & Configuration Instructions, Power Measurement, pp. 1-9, rev. date Jul. 25, 1997.

Engage Network, Inc., "Internet Protocol Card for Revenue Meters," http://www.engagenet.com. Link present as of Mar. 2000 on http://web.archive.org/web/20010306005433//www.engage.

"WebGate Iris (Internet Residential Information System)" http://www.munet.com/munetproducts.irisindex.html "Products," pp. 1-3 http://www.munet.com/munetproductsiris.html Prel.

"WebGate Icis (Internet Commerical Information System)," pp. 1 at http://www.munet.com/munetProductsIcisIndex.htm, "Products (WebGate ICIS Internet AMR now)," pp. 1-2 at http://.

"muNet's Demonstrates End-to-End IP-Based Energy Management System at DistribuTECH," pp. 1-2 at http://www.munet.com/muNetNewPressReleases_0205001.htm.

"muNet's WebGate IRIS Deployed for Utility Trials Across US", pp. 1-2 at http://www.munet.com/muNetNewPressReleases121300.htm.

"muNet's WebGate System Finds a Home on the Internet," pp. 1-2 at http://www.munet.com/muNetNewPressREleases031899.htm.

\* cited by examiner

POWER METER HAVING MULTIPLE ETHERNET PORTS

PRIORITY

The present application claims priority from a U.S. provisional patent application filed on Oct. 25, 2004 and assigned U.S. Provisional Application Ser. No. 60/621,750, the contents of which are incorporated herein by reference.

BACKGROUND OF THE INVENTION

1. Field of the Invention

The present disclosure relates generally to an electrical device, and more specifically, to a power meter having multiple Ethernet ports.

2. Description of the Prior Art

Power meters are used in industrial and energy utility applications to provide telemetry on power usage and power quality, including: transmitting power, energy, voltage and current readings, using serial communications channels. Some currently available power meters also have the capability to record waveforms based on predefined recording thresholds and transmit the waveform data.

In recent years, the industry has shifted from serial to Ethernet communication architectures allowing for faster data throughput and the ability to access data via the Internet. Because of this shift, there is a desire in the industry to provide meter readings over the Internet while still allowing access of the meters over an internal LAN for telemetry, control and programming. Currently, to accomplish these tasks, operators have been required to set up routers to control access to the meters. Unfortunately, this method is vulnerable to intruders, or hackers, who can potentially access the internal LAN via the Internet. Therefore, this security concern discourages the industry from allowing access to power meters via the Internet. Accordingly, a need exists for a power meter having two Ethernet ports, each of which is independent and communicatively isolated from each other in a manner which enables control of metering functions by authorized personnel via a LAN while preventing intrusion and malicious modification of these functions from unauthorized users via the Internet.

SUMMARY OF THE INVENTION

The present disclosure provides an electrical device having multiple Ethernet ports, and more particularly, to a power meter having two independent and communicatively isolated Ethernet ports and monitoring components for measuring an electrical parameter, such as current flow. The first Ethernet port is addressable by a first unique identifier and is configured for enabling full access to the power meter via an internal LAN. This enables a LAN operator to remotely access the power meter via the internal LAN for performing metering functions, such as full telemetry, control and programming.

The second Ethernet port is addressable by a second unique identifier and is configured for being connected to the Internet. Since the second Ethernet port is communicatively isolated from the first Ethernet port, a user, including the LAN operator, can access the power meter via the Internet, but cannot access the internal LAN by connecting to the power meter via the Internet.

The first and second unique identifiers are preferably MAC addresses. However, one skilled in the art can appreciate that other identifiers may be used to identify and address the first and second Ethernet ports.

The present disclosure further provides a method for communicating with a plurality of electrical devices or power meters 100. The method includes the step of providing a plurality of electrical devices or power meters 100 each having a first Ethernet port 214 and a second Ethernet port 222. Each Ethernet port has a unique identifier as and is communicatively isolated from the other Ethernet port. The method also includes the steps of accessing power meter 100 via first Ethernet port 214 via a first network, such as the internal LAN 810; and accessing power meter 100 via second Ethernet port 222 via a second network, such as the Internet or World Wide Web 812. Since the two Ethernet ports are communicatively isolated from each other, an Internet user cannot access internal LAN 810 by connecting to power meter 100 via the second Ethernet port-Internet connection. Conversely, the LAN operator cannot access Internet 812 by connecting to power meter 100 via the first Ethernet port-LAN connection.

The method further includes the step of remotely controlling the operation of one of the plurality of power meters 100 by transmitting control operations and parameters to the power meter 100 via a corresponding first Ethernet port-LAN connection. The method further includes the step of remotely accessing a storage module 818 of one of the plurality of power meters 100 via a corresponding second Ethernet port-Internet connection for viewing meter readings stored by storage module 818.

BRIEF DESCRIPTION OF THE DRAWINGS

These and other features, aspects, and advantages of the present disclosure will become better understood with regard to the following description, appended claims, and accompanying drawings wherein:

DESCRIPTION OF THE PREFERRED EMBODIMENTS

Three-phase power is most commonly used in situations where large amounts of power will be used because it is a more effective way to transmit the power and because it provides a smoother delivery of power to the end load. There are two commonly used connections for three-phase power, a wye connection or a delta connection.

As used herein and as is typical in the art, a "wye connection" is understood to have a phase relation and a winding relationship between the phases, which substantially approximates the look of a wye ("Y"). In a wye connection or service, the neutral (or center point of the wye) is typically grounded. This leads to common voltages of 208/120 and 480/277 (where the first number represents the phase-to-phase voltage and the second number represents the phase-to-ground voltage). The three voltages are separated by 120° electrically. Under balanced load conditions with unity power factor, the currents are also separated by 120°.

As used herein and as is typical in the art, a "delta connection" is understood to have load windings, which are connected from phase-to-phase rather than from phase-to-ground.

Embodiments of the present disclosure will be described in detail herein below with reference to the accompanying drawings. In the following description, numerous specific details are set forth to provide a more thorough understanding of the present disclosure. It will be apparent, however, to one skilled in the art that the present disclosure may be practiced without these specific details. In other instances, well known functions or constructions have not been described so as not to obscure the present disclosure.

Figure 1:
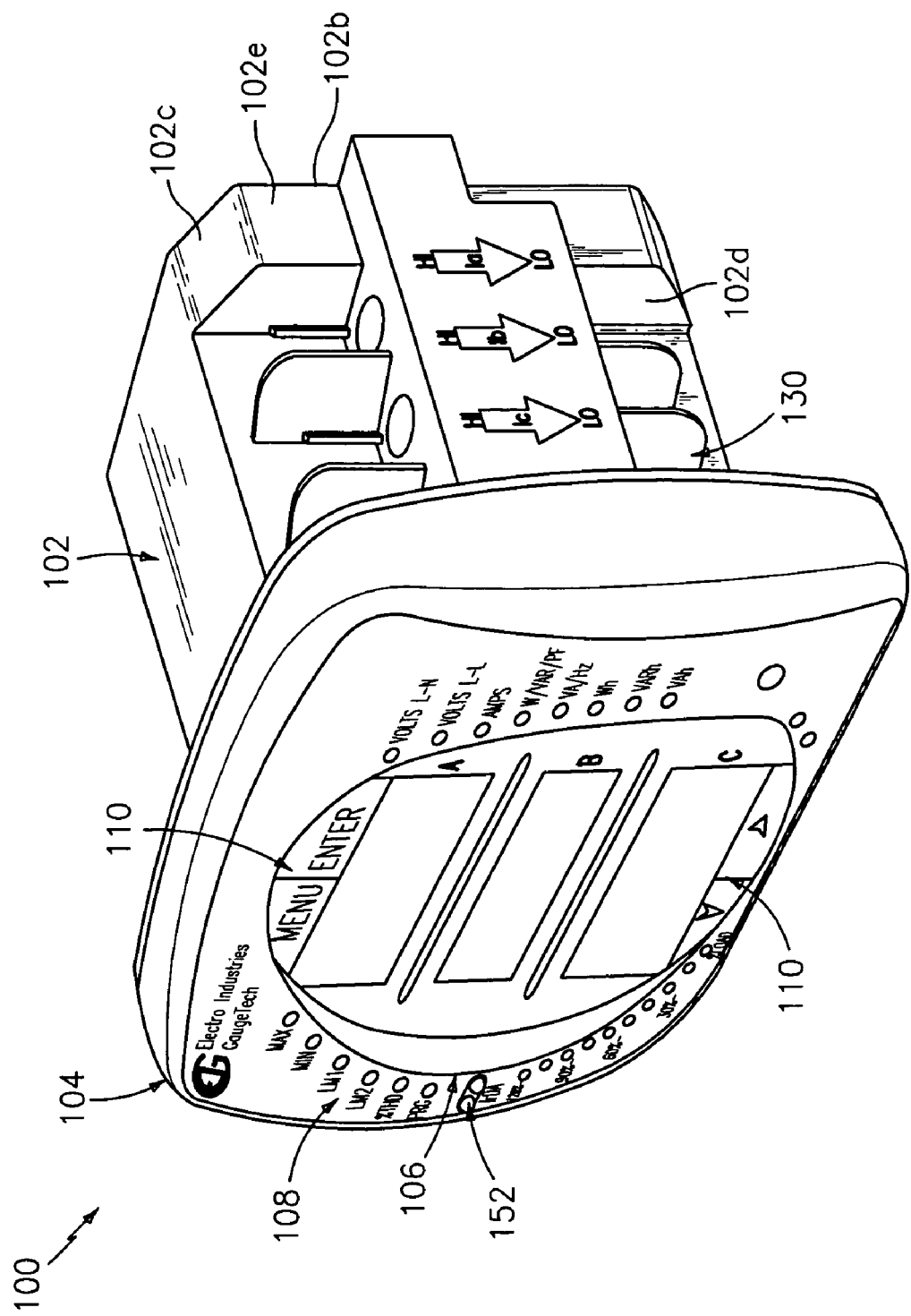
FIG. 1 is a perspective view of an electrical device having multiple Ethernet ports in accordance with the present disclosure.
Figure 2:
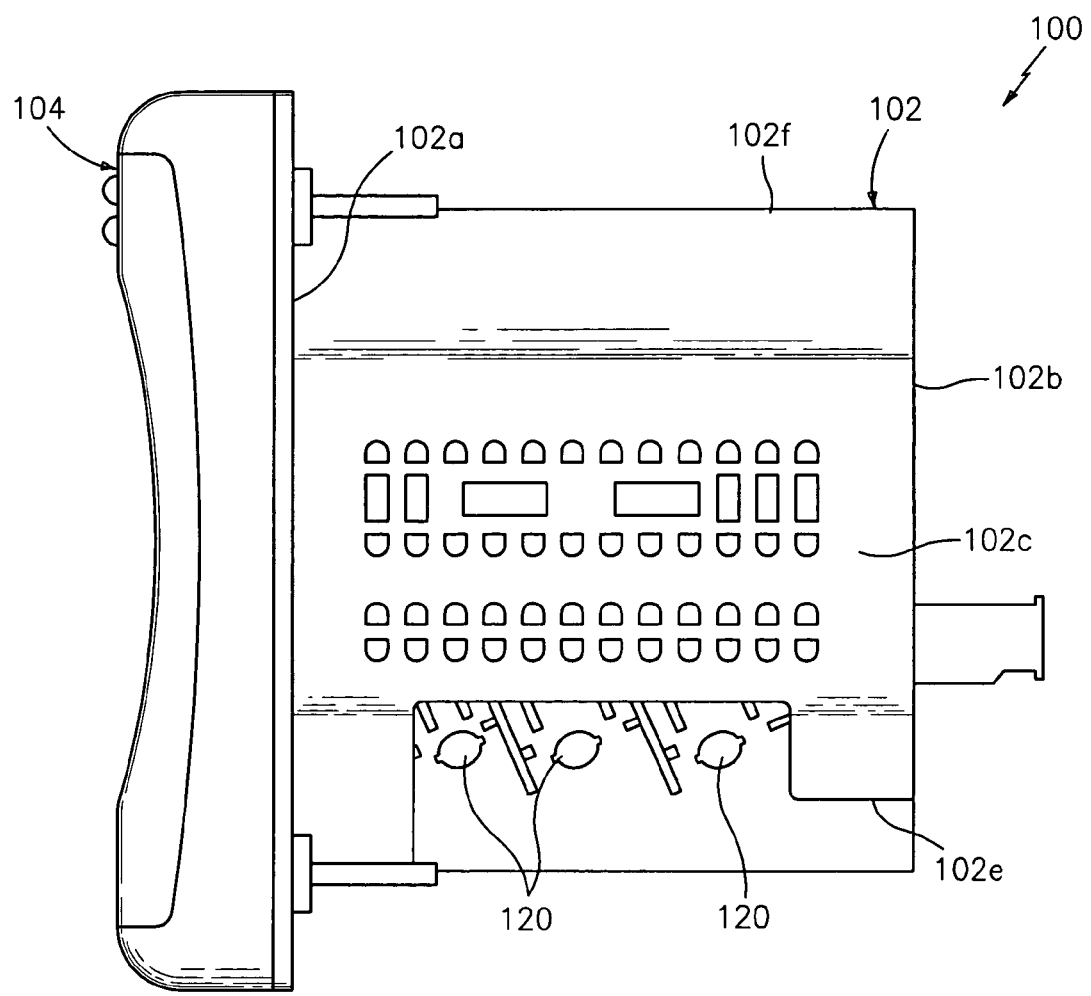
FIG. 2 is a top plan view of the electrical device of FIG. 1.
Figure 3:
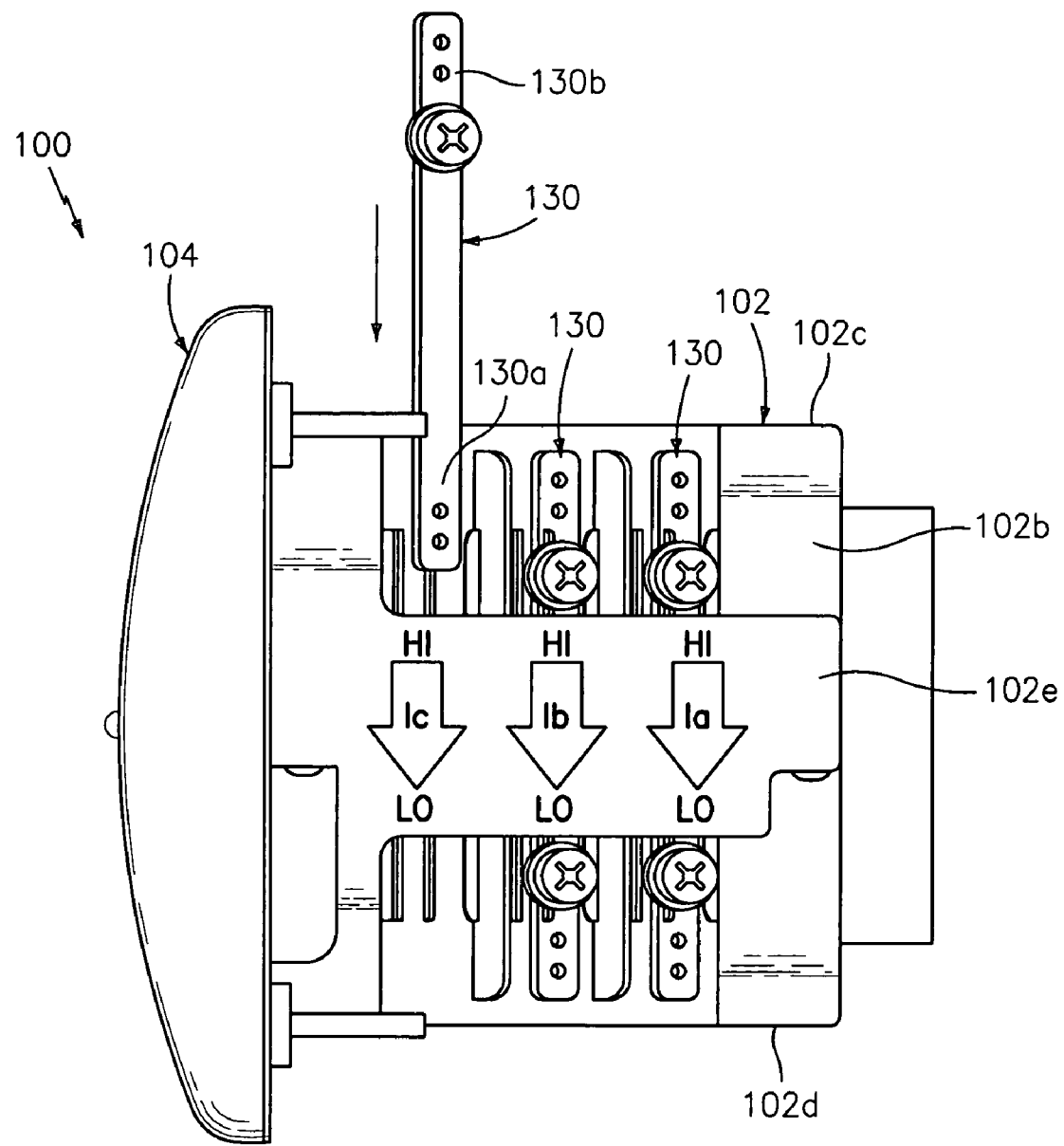
FIG. 3 is a side elevational view of the electrical device of FIGS. 1 and 2.

Referring initially to FIGS. 1-3, an electrical device, e.g., an electronic power meter, in accordance with an embodiment of the present disclosure, is generally designated as 100. As seen in FIGS. 1-3, electrical device 100 includes a housing 102 defining a front surface 102a, a rear surface 102b, a top surface 102c, a bottom surface 102d, a right side surface 102e, and a left side surface 102f. Electrical device 100 includes a faceplate 104 operatively connected to front surface 102a of housing 102.

Faceplate 104 includes displays 106, indicators 108 (e.g., LEDs and the like), buttons 110, and the like providing a user with an interface for visualization and operation of electrical device 100. For example, as seen in FIG. 1, faceplate 104 of electrical device 100 includes analog and/or digital displays 106 capable of producing alphanumeric characters. Faceplate 104 includes a plurality of indicators 108 which, when illuminated, indicate to the user the "type of reading", the "% of load bar", the "parameter designation" which indicates the reading which is being displayed on displays 106, a "scale selector" (e.g., Kilo or Mega multiplier of Displayed Readings), etc. Faceplate 104 includes a plurality of buttons 110 (e.g., a "menu" button, an "enter" button, a "down" button, a "right" button, etc.) for performing a plurality of functions, including and not limited to: viewing of meter information; enter display modes; configuring parameters; performing resets; performing LED checks; changing settings; viewing parameter values; scrolling parameter values; and viewing limit states.

As seen in FIGS. 4-7, electrical device 100 includes a first Ethernet port 214 and a second Ethernet port 222. The two Ethernet ports 214, 222 as further described below are independent and communicatively isolated from each other. The first Ethernet port 214 is configured for being connected to an internal LAN 810 while the second Ethernet port 222 is configured for being connected to the Internet or World Wide Web 812.

Figure 5:
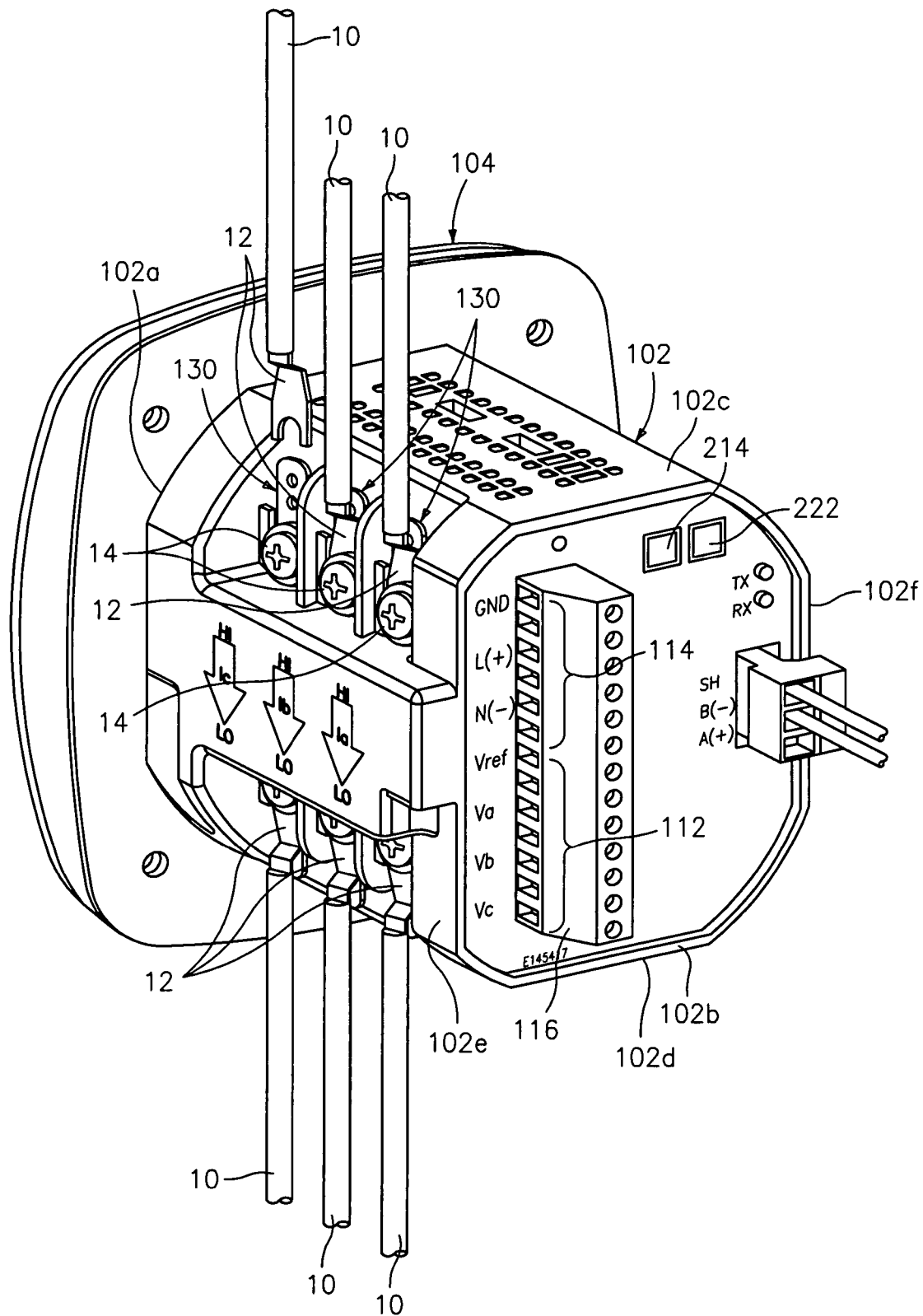
FIG. 5 is a rear perspective view of the electrical device of FIGS. 1-3 illustrating the connection of lead terminals thereto, in accordance with another method of the present disclosure.
Figure 6:
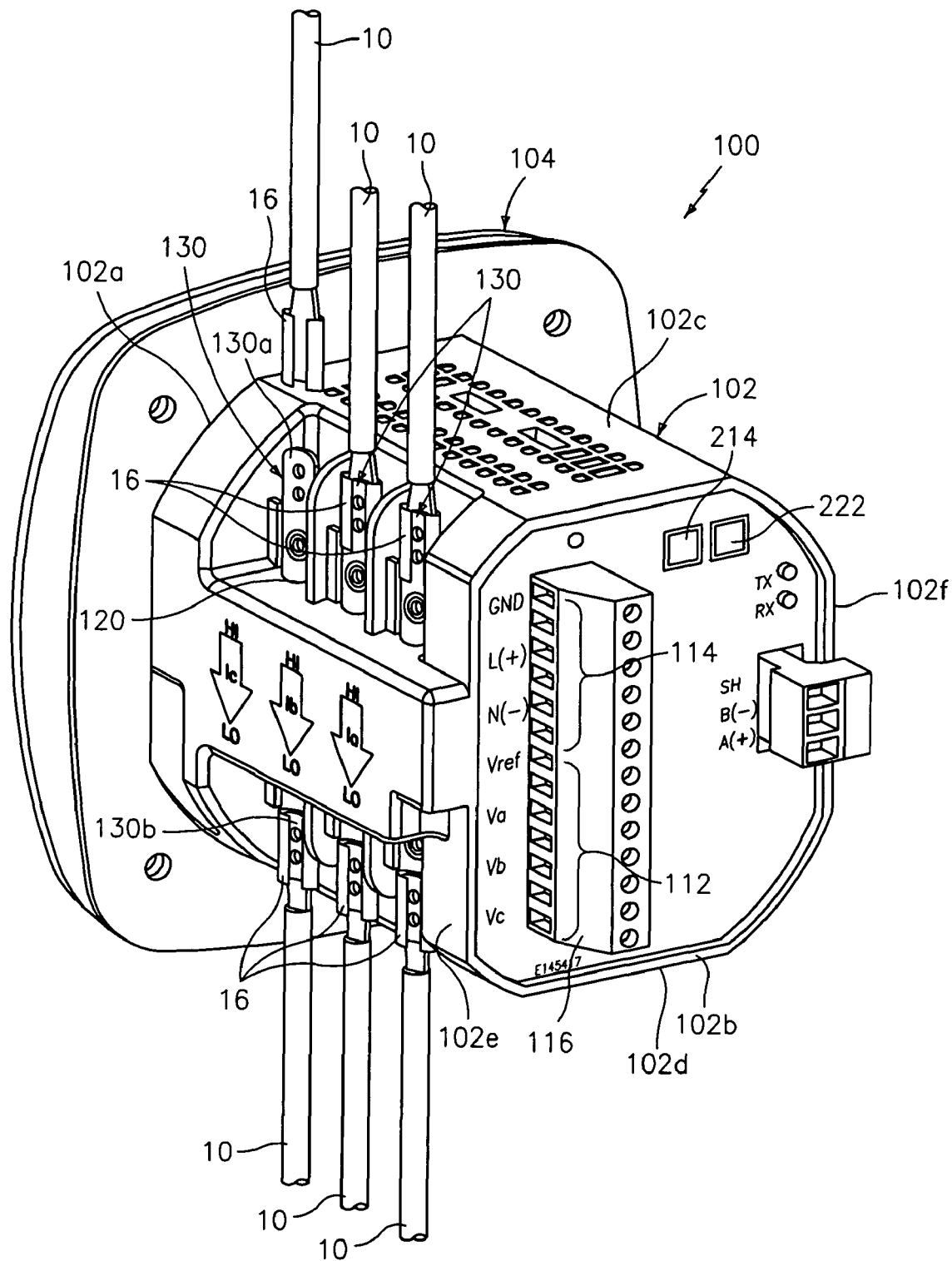
FIG. 6 is a rear perspective view of the electrical device of FIGS. 1-3 illustrating the connection of lead terminals thereto, in accordance with yet another method of the present disclosure.
Figure 7:
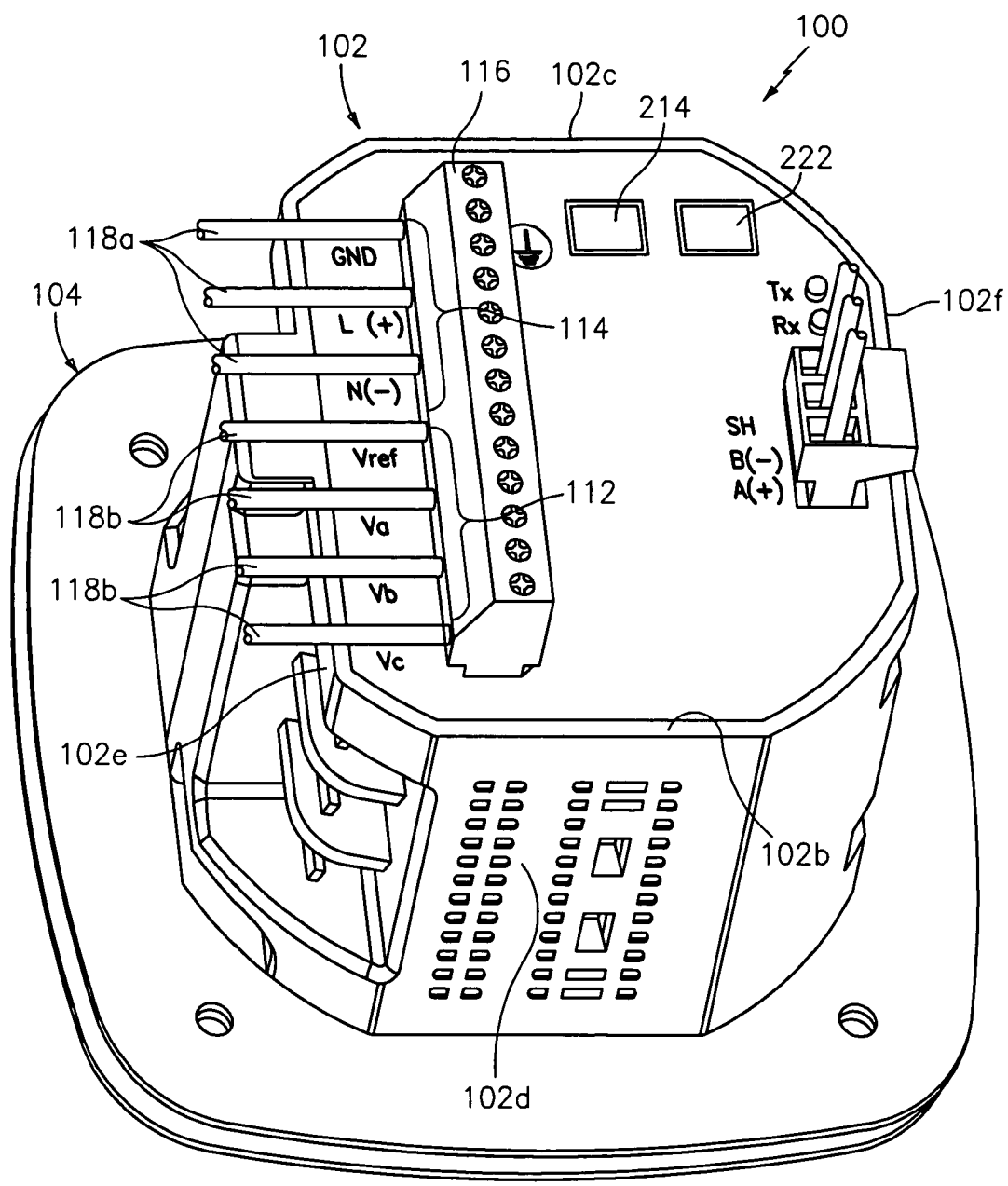
FIG. 7 is a rear perspective view of the electrical device of FIGS. 1-3 illustrating the connection of power supply and voltage inputs thereto, in accordance with a method of the present disclosure.

As further seen in FIGS. 4-7, housing 102 includes voltage connections or inputs 112 provided preferably on rear surface 102b thereof, and current inputs 114 provided preferably along right side surface 102e thereof. Desirably, a connector 116 or the like may be used to connect power supply lines 118a and/or voltage supply lines 118b to voltage inputs 112. In particular, as seen in FIG. 7, power supply lines 118a and voltage supply lines 118b are electrically connected to connector 116 which is, in turn, electrically connected to voltage inputs 112. Power supply lines 118a and voltage supply lines 118b are electrically connected to internal components, circuitry and/or printed circuit boards (not shown) of electrical device 100.

As seen in FIG. 2, housing 102 includes a series of pass-throughs or apertures 120 formed along right side surface 102e thereof and extending desirably between top surface 102c and bottom surface 102d thereof. While apertures 120 are shown and described as being formed along right side surface 102e of housing 102 it is envisioned and within the scope of the present disclosure for apertures 120 to be formed along any side of housing 102. As will be described in greater detail below, apertures 120 enable connection of electrical device 100 according to a first method, e.g., a "CT (Current Transformer) Pass Through" method.

As seen in FIG. 3, electrical device 100 may include a plurality of "gills" 130 configured and dimensioned to extend through each aperture 120 of housing 102. Gills 130 are desirably elongate electrically conductive plates or bars having a first end 130a and a second end 130b. As will be described in greater detail below, gills 130 allow for CT leads to be terminated on electrical device 100. Desirably, gills 130 are fabricated from nickel-plated brass.

Figure 4:
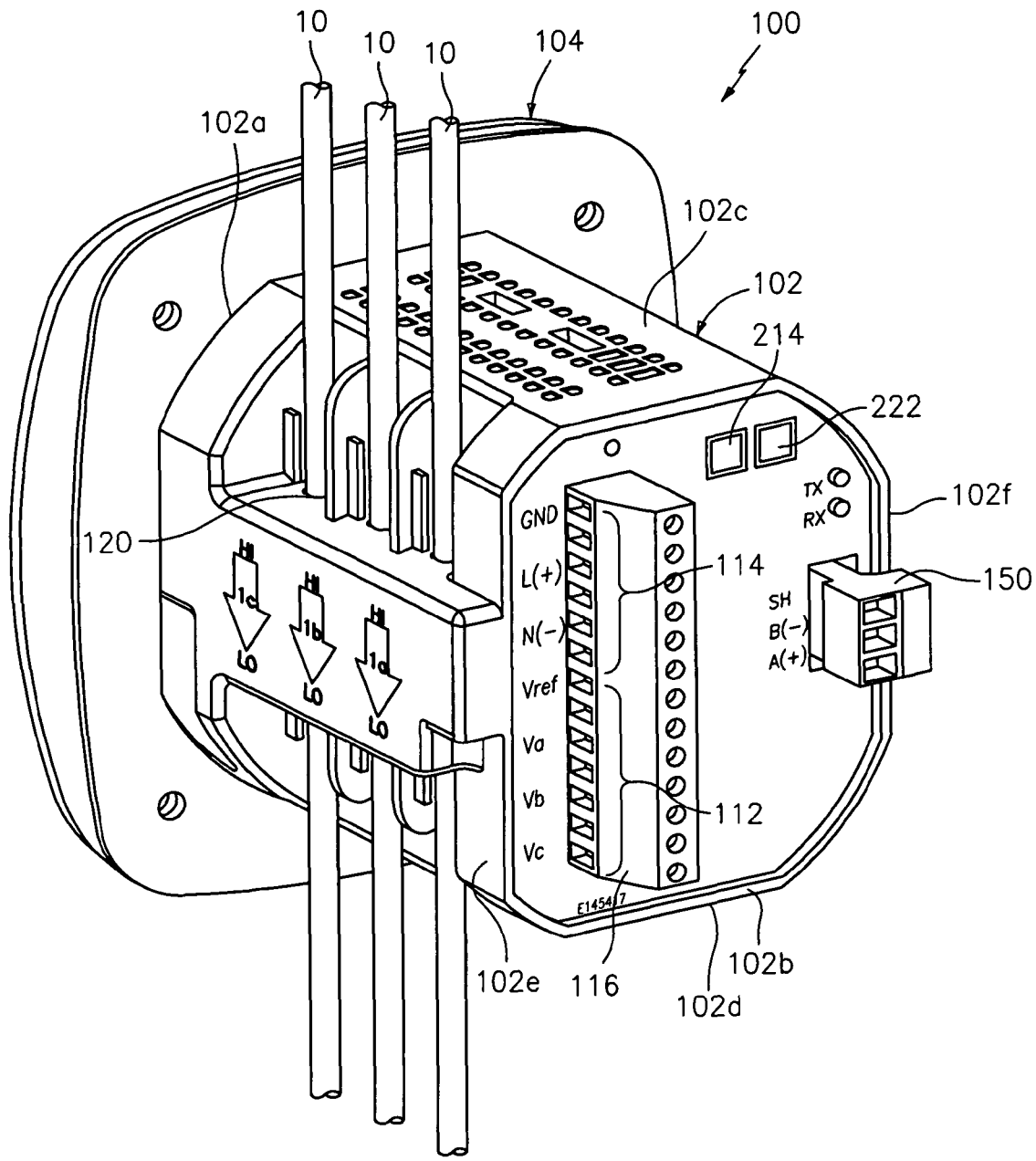
FIG. 4 is a rear perspective view of the electrical device of FIGS. 1-3 illustrating the connection of lead terminals thereto, in accordance with a method of the present disclosure.

Turning now to FIG. 4, a method of connecting electrical device 100 according to the "CT Pass Through" method is shown and described. Connection of electrical device 100 according to the "CT Pass Through" method typically requires passage of CT lead(s) 10 through apertures 120 of housing 102. Accordingly, CT lead(s) 10 pass directly though electrical device 100 without any physical termination on electrical device 100. Extending CT leads 10 to electrical device 100 according to the "CT Pass Through" method insures that electrical device 100 cannot be a point of failure on the circuit.

Turning now to FIG. 5, an alternate method of connecting electrical device 100 is shown and described. As seen in FIG. 5, gills 130 have been inserted into apertures 120 formed in housing 102. Desirably, first ends 130a of gills 130 are exposed along top surface 102c of housing 102 and second ends 130b of gills 130 are exposed along bottom surface 102d of housing 102. In this manner, CT leads 10 may be electrically connected to first ends 130a of gills 130 and/or second ends 130b of gills 130. Desirably, CT leads 10 are provided with an "O" or "U" lug 12 at a free end thereof for terminating CT leads 10 to gills 130. For example, a screw 14 or the like may be used to connect lug 12 of CT lead 10 to gill 130. As seen in FIG. 5, by terminating CT leads 10 to gills 130 of electrical device 100, the possibility of a point of failure occurring at electrical device 100 is eliminated.

As seen in FIG. 6, according to an alternate method, lugs 12 may be replaced by friction fit quick connectors 16. Accordingly, in use, CT leads 10 may be terminated and/or electrically connected to gills 130 by sliding quick connectors 16 over the tips of first and second ends 130a, 130b of gills 130.

In each of the embodiments above, CT leads 10 either extend through housing 102 of electrical device or terminate on gills 130 which are un-connected to any electrical component of electrical device 100. Unlike the embodiments disclosed herein, other electrical device (e.g., electrical meters) utilize terminal blocks to pass the current, traveling through the CT leads, through a soldered connection on a printed circuit board. Accordingly, the prior art electrical devices may be susceptible to burn-out or failure in the event of a surge in current through the CT leads.

Turning back to FIG. 4, electrical device 100 may include a first interface or communication port 150 for connection to a master and/or slave device. Desirably, first communication port 150 is situated in rear surface 102b of housing 102. Electrical device 100 may also include a second interface or communication port 152 situated on faceplate 104 (see FIG. 1).

Figure 8:
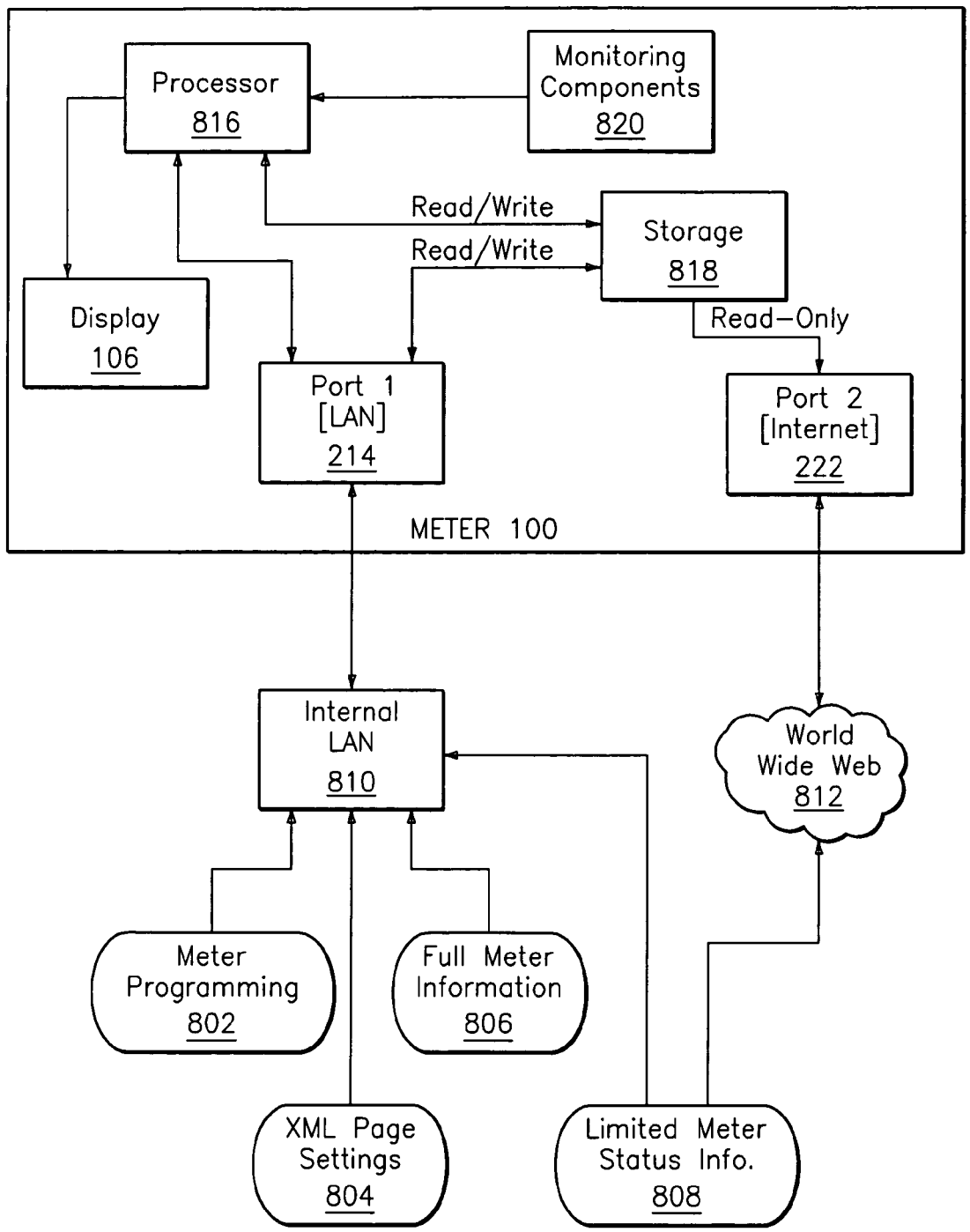
FIG. 8 is a flowchart showing allowable access paths for accessing the electrical device having multiple Ethernet ports in accordance with the present disclosure.

Referring to FIG. 8, electrical device 100 provides access to status information and other data stored within a storage module 818, such as a flash memory module, via second Ethernet port 222. Second Ethernet port 222 is configured for being connected to Internet or World Wide Web 812 as stated above for enabling access to the status information and other data. Second Ethernet port 222 can be connected to the Internet or World Wide Web 812 by one or more network communication protocols known in the art, such as TCP/IP.

Second Ethernet port 222 does not have access to a processor 816 and monitoring components 820 of electrical device 100. Hence, access to electrical device 100 via the Internet does not enable a user to delete and/or reprogram functions programmed within processor 816 of electrical device 100 or program electrical device 100. Additionally, the user cannot communicate or access LAN 810 via the second Ethernet port-Internet connection. Accordingly, the architecture of electrical device 100 prevents unauthorized access to processor 816 and LAN 810 (or other device connected to first Ethernet port 214), while allowing access to stored data within electrical device 100 via Internet 812. Port 1 enables the user to configure what is to be placed on the port 2 address so that no "hacker or unwanted viewer of the data can use the meter to "hack" into a general network and/or operate or control the equipment. This creates a dedicated impenetrable firewall within the meter allowing only the data the user desires to be placed on the web sever to go through, as will be described below.

In an alternate embodiment, second Ethernet port 222 does have access to the processor 816 and monitoring components 820 of electrical device 100. However, Ethernet port 214 dictates or controls what data stored within processor 816 can be accessed via Ethernet port 222. In this embodiment, one cannot program processor 816 by accessing it via Ethernet port 222.

Preferably, processor 816 of electrical device 100 is programmed by the transmission of programming signals from internal LAN 810 via the first Ethernet port-LAN connection for enabling the creation of web browser viewable documents, which are stored in storage module 818. The documents may be created in XML, HTML, or other webpage formats. Second Ethernet port 222 provides read-only access to storage module 818, thus allowing an Internet user to view the web browser viewable documents via the second Ethernet port-Internet connection while preventing the Internet user from modifying these documents and other data stored by storage module 818. Further, the Internet user is prevented from causing the storage of data within storage module 818 via the second Ethernet port-Internet connection.

With continued reference to FIG. 8, electrical device 100 enables an array of functions, e.g., meter programming 802, webpage setup 804, preferably, XML webpage setup, complete or full meter status information 806 and limited meter status information 808, to be performed by an operator/user via internal LAN 810 or Internet 812. While the full array of functions 802, 804 can be performed and status information 806, 808 (including other type of information) can be accessed via the first Ethernet port-internal LAN connection, only limited meter status information 808 can be accessed via the second Ethernet port-Internet connection.

Ethernet port 214 is configured for connection to internal LAN 810, for providing access to processor 816 and for providing read/write access to storage module 818. Processor 816 is remotely accessible and programmable via the first Ethernet port-LAN connection for controlling various functions of electrical device 100. Processor 816 parses and implements the programmable instructions received via the first Ethernet port-LAN connection and which are embedded within programming signals for controlling the various functions of electrical device 100. These functions include setting the operational parameters of monitoring components 820; receiving data, such as meter readings, from monitoring components 820 and processing said data; executing diagnostic tests on monitoring components 820; controlling monitoring components 820 for measuring one or more electrical parameters, such as current flow; creating and/or maintaining webpages for storage in storage module 818; and other functions. The webpages display one or more meter readings and parameters to the Internet user via the user's computer terminal connected to electrical device 100 via the second Ethernet port-Internet connection.

Webpages are created by the LAN operator providing page settings 804, such as XML page settings, to electrical device 100 via the first Ethernet port-LAN connection. The page settings 804 generally include selecting information to be displayed via the webpages, refresh rate of the information displayed, and selecting basic webpage layout. Processor 816 using page settings 804 creates webpages displaying the information received from monitoring components 820 and stores the created webpages in storage module 818. Processor 816 continuously refreshes the webpages according to the refresh rate specified by the operator, whereupon updated meter readings and other information replaces or overwrites the outdated information displayed by the webpages.

It is contemplated that the updated meter readings are appended to a table containing previous meter readings and displayed by a webpage, such that the previous meter readings are not replaced or overwritten. The meter readings and other data viewable via the webpages are generally or substantially identical to the meter readings and data displayed on displays 106 of electrical device 100, since processor 816 is in operative communication with the displays 106.

Access to the storage medium 818 via the second Ethernet port-Internet connection transmits one or more webpages to the Internet user's computer terminal for viewing thereof. It is contemplated that the Internet user provides a password which is authenticated by the electrical device 100 before the one or more webpages are transmitted to the user's computer terminal.

Ethernet port 214 is addressable via a first unique identifier and Ethernet port 222 is addressable via a second unique identifier. First and second unique identifiers are preferably MAC addresses. However, one skilled in the art can appreciate that other identifiers may be used to identify and address the first and second Ethernet ports.

The present disclosure further provides a method for communicating with a plurality of electrical devices or power meters 100. The method includes the step of providing a plurality of electrical devices or power meters 100 each having a first Ethernet port 214 and a second Ethernet port 222. Each Ethernet port has a unique identifier as and is communicatively isolated from the other Ethernet port, such that electrical signals are prevented from being transmitted from the second Ethernet port-Internet connection to the first Ethernet port-LAN connection.

The method also includes the steps of programming power meter 100 via first Ethernet port 214 via a first network, such as the internal LAN 810; and accessing data stored within power meter 100 via first Ethernet port 214 via the first network and/or second Ethernet port 222 via a second network, such as the Internet or World Wide Web 812. Since the two Ethernet ports are communicatively isolated from each other, an Internet user cannot access internal LAN 810 by connecting to power meter 100 via the second Ethernet port-Internet connection. Conversely, the LAN operator cannot access Internet 812 by connecting to power meter 100 via the first Ethernet port-LAN connection.

The method further includes the step of remotely controlling the operation of one of the plurality of power meters 100 by transmitting control operations and parameters to the power meter 100 via a corresponding first Ethernet port-LAN connection. The control operations and parameters can specify what to measure (current flow, power, voltage output, etc.), what data to display via displays 106, how often status data is to be updated, etc. The method further includes the step of remotely accessing a storage module 818 of one of the plurality of power meters 100 via a corresponding second Ethernet port-Internet connection for viewing meter readings stored by storage module 818.

Figure 9:
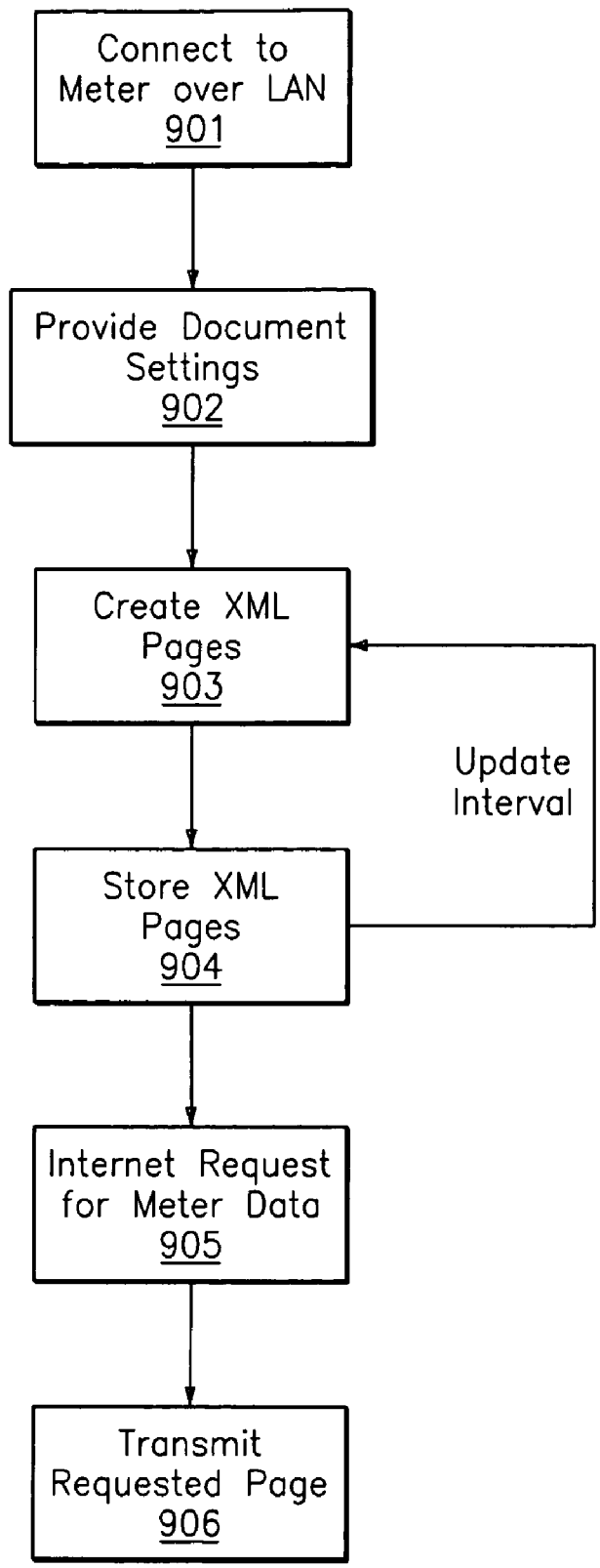
FIG. 9 is a flowchart illustrating a method for accessing the electrical device via a LAN and the Internet in accordance with the present disclosure.

As shown in FIG. 9, the present disclosure further provides a method for retrieving power meter data across both LAN 810 and Internet 812 while maintaining security from unauthorized intrusion and hacking of LAN 810 via Internet 812. The method is initiated with step 901, wherein the LAN operator connects to electrical device or meter 100 through LAN 810 via the first Ethernet port-LAN connection. This connection provides the LAN operator with full access to all the features of meter 100, i.e., programmable, control and data access features of meter 100.

In step 902, the LAN operator provides document settings specifying which meter readings will be reported and how often the meter readings will be updated on the webpages created by processor 816 in step 903. Processor 816 acquires meter readings, or status data, from one or more monitoring components 820, such as a probe, and in accordance with the document settings provided in step 902, processor 816 parses the status data and creates webpages for displaying the data. In step 904, the webpages are stored in the storage module 818, such as an optical media, hard drive, RAM, flash memory module, etc. At the update interval specified in the document settings provided in step 902, steps 903 and 904 are repeated, thereby updating the meter readings which are displayable via the webpages.

Accessing the limited meter readings via the second Ethernet port-Internet connection occurs in step 905, wherein the Internet user transmits a request for viewing a webpage stored within storage module 818 of power meter 100. The webpage can include a homepage, i.e., introductory or index, page, which provides hyperlinks to various other webpages stored in storage module 818. Proceeding to step 906, the requested webpage is retrieved from storage module 818 and transmitted to the Internet user via the second Ethernet port-Internet connection.

The described embodiments of the present disclosure are intended to be illustrative rather than restrictive, and are not intended to represent every embodiment of the present disclosure. Various modifications and variations can be made without departing from the spirit or scope of the disclosure as set forth in the following claims both literally and in equivalents recognized in law.

What is claimed is:

1. An electrical device comprising:
   at least one monitoring component configured for monitoring at least one parameter of an electrical distribution system;
   at least one processor configured for receiving data from the at least one monitoring component and transmitting at least a portion of the data to at least one of a first and second Ethernet ports;
   the first Ethernet port having a first unique MAC address and configured for connecting to a first network, the first network being a Local Area Network (LAN); and
   the second Ethernet port having a second unique MAC address and communicatively isolated from said first Ethernet port, said second Ethernet port configured for connecting to a second network, the second network being the Internet,
   wherein said electrical device does not allow access to said first network via a connection of said second Ethernet port to said second network, and wherein the electrical device is an electrical power meter.

2. The electrical device of claim 1, wherein said electrical device is configured for receiving programming signals via said first Ethernet port for programming said processor.

3. The electrical device of claim 1, wherein said first Ethernet port is in operative communication with said processor.

4. The electrical device of claim 1, further comprising a storage module configured for storing data, wherein said data is accessible via at least one of said first and second Ethernet ports.

5. The electrical device of claim 4, wherein said data is transmitted within at least one webpage via said second Ethernet port.

6. The electrical device of claim 5, further comprising at least one display in operative communication with said processor, and wherein data displayed by said at least one display is substantially identical to data transmitted within said at least one webpage.

7. The electrical device of claim 4, wherein said first Ethernet port has read/write access to said storage module.

8. The electrical device of claim 4, wherein said second Ethernet port has read-only access to said storage module.

9. A metering device adapted for monitoring at least one parameter of an electrical utility, comprising:
   components monitoring the at least one parameter;
   a storage module configured to store the at least one parameter;
   a first communication port selectively adapted for coupling the metering device to a Local Area Network (LAN), wherein the first communication port is an Ethernet port having a first unique MAC address;
   a second communication port selectively adapted for coupling the metering device to the Internet, wherein the second communication port is an Ethernet port having a second unique MAC address; and
   at least one processor adapted for administering operation of said components, the storage module, and the first and second communication ports
   wherein the second communication port is communicatively isolated from the first communication port and does not allow access to the LAN via a connection to the second communication port over the internet.

10. The metering device of claim 9, wherein:
the first communication port is coupled to the at least one processor and the storage module;
the second communication port is coupled to the storage module; and
the second communication port is communicatively isolated from said components, the at least one processor, and the first communication port.

11. The metering device of claim 9, wherein said device is adapted for providing via the first communication port or the second communication port selective access to information stored in the storage module (FIG. 8).

12. The metering device of claim 11, wherein access to the storage module or the information via the second communication port is available on a read-only basis.

13. The metering device of claim 12, wherein said access is regulated per instructions transmitted via the first communication port.

14. The metering device of claim 11, wherein the information includes at least one of: an identifier of the device; instantaneous or historic output data of the device; and configuration, service, or diagnostic records of the device.

15. The metering device of claim 11, wherein information accessible via the second communication port is presented in a form of web pages viewable using at least one Internet browser.

16. The metering device of claim 15, wherein the web pages are created using HTML or XML programming languages.

17. The metering device of claim 9, wherein said device is adapted for: providing via the first communication port access to operational functions of the device, said operational functions including programming or re-programming the device; and blocking access via the second communication port to the operational functions.

18. The metering device of claim 9, wherein said device is adapted for establishing a communication link with a remote terminal or remote computer of the LAN or the Internet upon positive electronic authentication of a user of the terminal or remote computer.

19. The metering device of claim 9, wherein said device further comprises a display adapted for displaying numerical values of the at least one parameter or configuration settings of the device.

20. The metering device of claim 9, wherein said device further comprises a third communication port adapted for providing a master/slave connection between said device and a remote apparatus.

21. The metering device of claim 9, further comprising a firewall configured to isolate the second communication port from said components, the at least one processor, and the first communication port.

22. A system comprising at least one metering device of claim 9.

23. A metering device adapted for monitoring at least one parameter of an electrical utility, comprising:
components monitoring the at least one parameter;
a storage module;
a first means of communication selectively adapted for coupling the metering device to a Local Area Network (LAN), wherein the first means of communications is an Ethernet port having a first unique MAC address;
a second means of communication selectively adapted for coupling the metering device to the Internet, wherein the second means of communications is an Ethernet port having a second unique MAC address; and
at least one processor adapted for administering operation of said components, the storage module, and the first and second means, wherein the second means of communication is communicatively isolated from the first means of communication and does not allow access to the LAN via a connection to the second means of communication over the Internet.

24. The metering device of claim 23, wherein:
the first means is coupled to the at least one processor and the storage module; the second means is coupled to the storage module; and
the second means is communicatively isolated from said components, the at least one processor, and the first means.

25. The metering device of claim 23, wherein said device is adapted for providing via the first means or the second means selective access to information stored in the storage module.

26. The metering device of claim 25, wherein access to the storage module or information via the second means is available on a read-only basis.

27. The metering device of claim 26, wherein said access is regulated per instructions transmitted via the first means.

28. The metering device of claim 25, wherein the information includes at least one of:
an identifier of the device;
instantaneous or historic output data of the device; and
configuration, service, or diagnostic records of the device.

29. The metering device of claim 25, wherein said device is adapted for (i) presenting information accessible via the second means in a form of web pages viewable using at least one Internet browser and (ii) creating the web pages using HTML or XML programming languages.

30. The metering device of claim 23, wherein said device is adapted for: providing via the first means access to operational functions of the device, said operational functions including programming or re-programming the device; and blocking access via the second means to the operational functions.

31. The metering device of claim 23, wherein each of the first means and the second means is selectively provided with a unique address and adapted for establishing a communication link with a remote terminal or remote computer of the LAN or the Internet upon positive electronic authentication of a user of the terminal or remote computer.

32. The metering device of claim 23, wherein said device further comprises at least one of:
a display adapted for displaying numerical values of the at least one parameter or configuration settings of the device; and
third means adapted for providing a master/slave connection between the device and a remote apparatus.

33. The metering device of claim 23, further comprising a firewall configured to isolate the second means of communication from said components, the at least one processor, and the first means of communication.

34. A system comprising at least one metering device of claim 23.

* * * * *